US010158354B2

(12) United States Patent
Dutta et al.

(10) Patent No.: US 10,158,354 B2
(45) Date of Patent: Dec. 18, 2018

(54) APPARATUS WITH ELECTRONIC CIRCUITRY HAVING REDUCED LEAKAGE CURRENT AND ASSOCIATED METHODS

(71) Applicant: Silicon Laboratories Inc., Austin, TX (US)

(72) Inventors: Arnab Kumar Dutta, Austin, TX (US); Essam Atalla, Austin, TX (US); Nicholas M. Atkinson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/429,690

(22) Filed: Feb. 10, 2017

(65) Prior Publication Data

US 2018/0234089 A1 Aug. 16, 2018

(51) Int. Cl.
*H03K 17/61* (2006.01)
*H03K 17/16* (2006.01)

(52) U.S. Cl.
CPC ... *H03K 17/161* (2013.01); *H03K 2217/0036* (2013.01)

(58) Field of Classification Search
CPC ......... H03K 19/0016; H03K 19/00315; H03K 19/0963; G11C 16/14; G11C 16/16; G11C 8/08; G11C 16/08; G11C 16/10; G11C 7/04; G11C 7/12; G11C 7/18
USPC ....... 327/108, 541; 365/189.11, 185.23, 226, 365/230.06
See application file for complete search history.

(56) References Cited

U.S. PATENT DOCUMENTS

| 6,025,737 A * | 2/2000 | Patel ................. H03K 19/0027 326/68 |
| 6,144,075 A | 11/2000 | Chi |
| 8,743,628 B2 * | 6/2014 | Kim ..................... G11C 11/4085 365/185.23 |
| 2010/0157716 A1 * | 6/2010 | Lee .......................... G11C 8/08 365/230.06 |

OTHER PUBLICATIONS

Tomar et al., *Low Power Deign of Standard Digital Gate Design Using Novel Sleep Transistor Technique*, Int'l J. of Modern Eng'g Research Apr. 2014, 7 pp.
Fallah et al., *Standby and Active Leakage Current Control and Minimization in CMOS VLSI Circuits*, IEICE Transactions on Electronics 88-C(4):509-519 • Apr. 2005, 21 pp.
Parke et al., *Design for Suppression of Gate-Induced Drain Leakage in LDD MOSFET's Using a Quasi-Two-Dimensional Analytical Model*, IEE Transactions on Electron Devices, Jul. 1992, 10 pp.
Shah et al., *Comparative Study of Area, Delay and Power Dissipation for LECTOR and INDEP (Leakage ControlTechniques) At 70 nm Technology Node*, 2015 IEEE Int'l Advance Computing (IACC), Jun. 2015, 6 pp.

* cited by examiner

*Primary Examiner* — John Poos
(74) *Attorney, Agent, or Firm* — Law Offices of Maximilian R. Peterson

(57) ABSTRACT

An apparatus includes an integrated circuit (IC), which includes complementary metal oxide semiconductor (CMOS) circuitry that includes a pull-up network coupled to a supply voltage and at least one input signal. The IC further includes a first metal oxide semiconductor (MOS) transistor coupled to the pull-up network and to a first bias voltage to reduce a gate-induced drain leakage (GIDL) current of the CMOS circuitry.

20 Claims, 17 Drawing Sheets

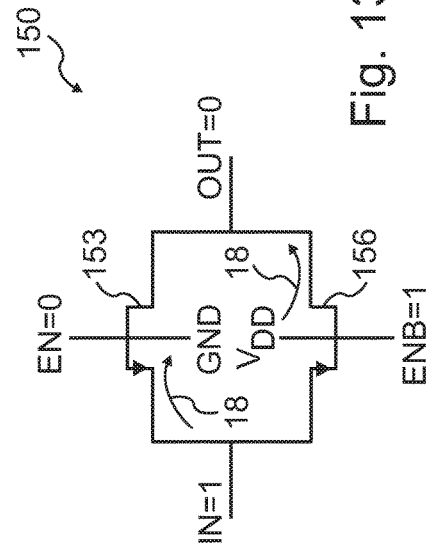
Fig. 12
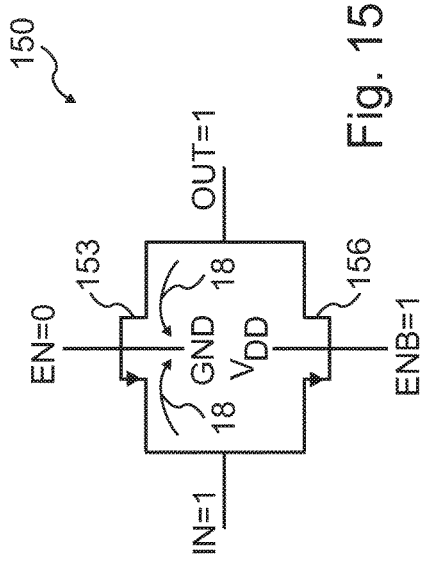
Fig. 13
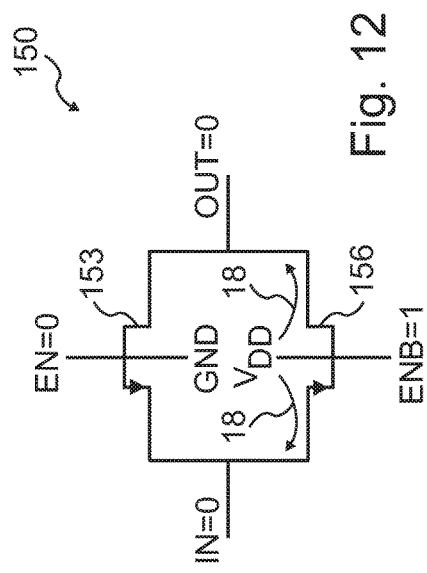
Fig. 14
Fig. 15

US 10,158,354 B2

APPARATUS WITH ELECTRONIC CIRCUITRY HAVING REDUCED LEAKAGE CURRENT AND ASSOCIATED METHODS

TECHNICAL FIELD

The disclosure relates generally to electronic circuitry with improved power consumption and, more particularly, to integrated circuit (IC) apparatus with reduced power consumption, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

The result has been a growing trend to produce circuitry and systems with increased numbers of transistors and similar devices. The increased number of devices has also coincided with increased power consumption of electronic circuits, such as ICs. Various mechanisms, such as device leakage, underlie the increased power consumption. Technologies such as complementary metal oxide semiconductor (CMOS), which are used in a variety of IC devices, use devices such as transistors with leakage currents.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an IC, which includes CMOS circuitry that includes a pull-up network coupled to a supply voltage and at least one input signal. The IC further includes a first metal oxide semiconductor (MOS) transistor coupled to the pull-up network and to a first bias voltage to reduce a gate-induced drain leakage (GIDL) current of the CMOS circuitry.

According to another exemplary embodiment, an apparatus includes an IC, which includes CMOS circuitry that includes a pull-down network coupled to a ground potential and at least one input signal. The IC further includes a first MOS transistor coupled to the pull-down network and to a first bias voltage to reduce a GIDL current of the CMOS circuitry.

According to another exemplary embodiment, a method of reducing a GIDL current of at least one transistor in a CMOS circuit includes biasing a MOS transistor coupled to the at least one transistor by applying a bias voltage to a gate of the MOS transistor so as to reduce a drain-bulk voltage of the at least one transistor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

FIGS. 12-15 illustrate leakage mechanisms in various states of a CMOS transmission gate.

DETAILED DESCRIPTION

The disclosed concepts relate generally to improving the performance of electronic circuitry. More specifically, the disclosed concepts provide apparatus and methods for reducing the leakage and, thus, improving or reducing the power consumption of, electronic circuitry, such as ICs. Rather than modifying the semiconductor fabrication process, the techniques according to the disclosure use circuit-based approaches to reducing the leakage current of CMOS circuitry, as described below in detail.

Figure 1:
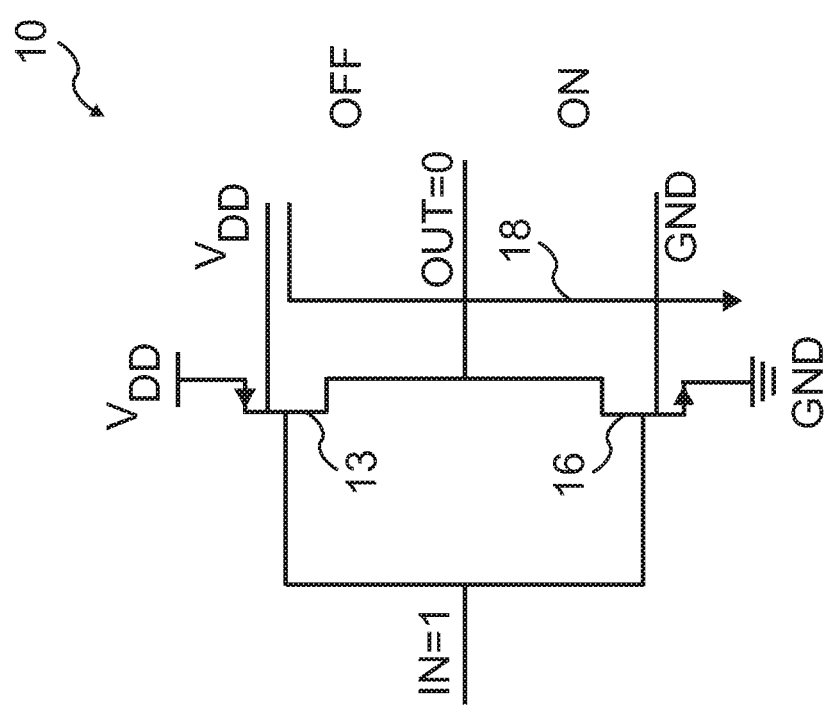
FIG. 1 illustrates a leakage mechanism in one state of a CMOS inverter.

CMOS circuitry, such as an inverter, can have several leakage mechanisms. For example, considering an inverter 10, as shown in FIG. 1, the gates of transistor 13 and transistor 16 tend to leak current. In other words, the oxide layer used to construct the gates of the transistors is not a perfect insulator, which results in some leakage current. Generally, reverse-biased PN junctions will also leak a certain amount of current and therefore increase the overall leakage current of inverter 10.

Inverter 10 in FIG. 1 also exhibits other leakage mechanisms. For instance, gate-induced drain leakage (GIDL)

current may constitute a relatively large or substantial part of the total leakage current for CMOS circuits such as inverter 10. More specifically, GIDL may contribute a relatively large or substantial amount to the overall leakage of CMOS circuits employing lightly-doped drain (LDD) transistors designed for operation with relatively high supply voltages ($V_{DD}$), say, greater than 3 volts.

Generally, the GIDL mechanism and the effects of LDD are known to, and understood by, persons of ordinary skill in the art. A brief summary is provided below.

GIDL is a phenomenon where current flows between the bulk and the drain regions of a metal-oxide-semiconductor field effect transistor (MOSFET) because of the bulk-drain junction getting modulated by the gate-drain voltage. The GIDL phenomenon is sometimes associated with higher than normal operating voltages (for example, write voltages used to write date to flash memory cells). The GIDL phenomenon, however, can also happen at regular or nominal operating voltages in CMOS circuits where LDD transistors are used. LDD transistors are typically used to allow or tolerate higher voltages across the bulk-drain PN-junctions of transistors. Leakage because of the GIDL phenomenon is independent of temperature.

GIDL is typically a relatively strong function of the drain-bulk voltage ($V_{DB}$) when the MOSFET is in the off state (i.e., the gate-source voltage, $V_{GS}$, is 0 or below the threshold voltage, $V_T$). This condition is common in CMOS circuits. Consequently, GIDL can constitute a relatively large or even dominant leakage mechanism at room temperature for CMOS circuits.

Referring again to FIG. 1, inverter 10 includes P-channel MOS (PMOS) transistor 13 and N-channel MOS (NMOS) transistor 16. Assuming that transistor 13 and transistor 16 constitute LDD transistors, when the input voltage has a logic 1 value, transistor 16 is on, and transistor 13 is off. The drain of transistor 13 is at or nearly at ground potential (VSS) (because transistor 16 is on, thus pulling the output (OUT) to the ground potential, or logic 0), and the drain of transistor 13 is coupled to the supply voltage.

Consequently, the drain-bulk voltage ($V_{DB}$) of transistor 13 is relatively large, which leads to leakage because of GIDL. Path 18 shows the path through which the leakage current flows. Specifically, current flows from the supply source through transistor 13, through transistor 16, and finally to the ground node.

Figure 2:
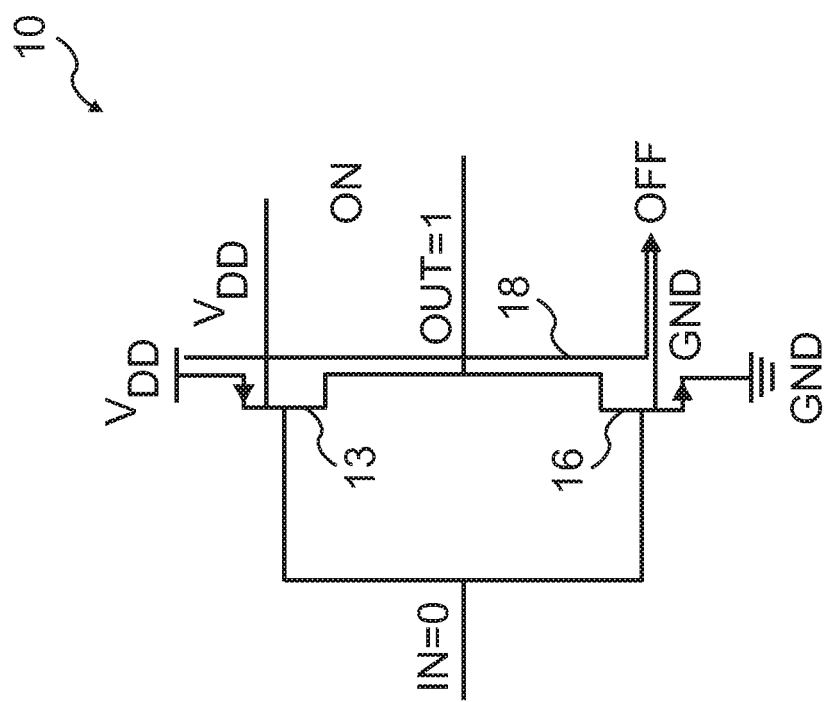
FIG. 2 depicts a leakage mechanism in another state of a CMOS inverter.

A similar phenomenon causes GIDL current when the input voltage has a logic 0 value. FIG. 2 shows this situation. Referring to FIG. 2, transistor 13 is on and, thus, conducting. Conversely, transistor 16 is off, as its gate-source voltage is below its threshold voltage.

Even though it is in the off state, transistor 16 has a relatively large drain-bulk voltage ($V_{DB}$). More specifically, the drain of transistor 16 has a relatively large voltage, i.e., at or near the supply voltage, as transistor 13 is on and pulls up the output node towards the supply voltage. The bulk of transistor 16, however, is coupled to the ground potential. As a result, transistor 16 has a relatively large drain-bulk voltage ($V_{DB}$), which leads to leakage because of GIDL. Path 18 shows the path through which the leakage current flows. Specifically, current flows from the supply source through transistor 13, through transistor 16, and finally to the ground node through the bulk or bulk region of transistor 16.

Figure 3:
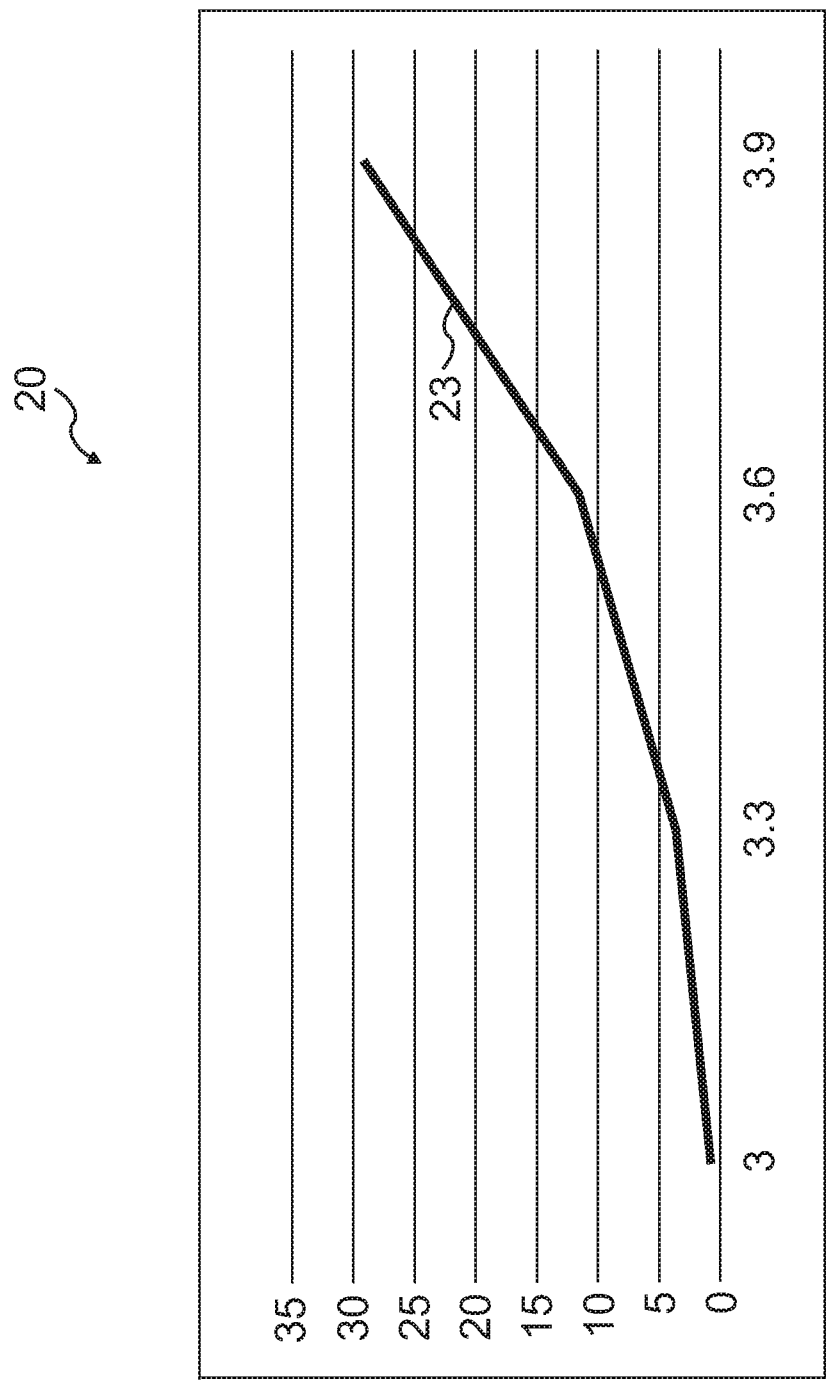
FIG. 3 shows a plot of leakage current as a function of the drain-bulk voltage of a transistor.

As noted, GIDL current of a transistor is a function of the drain-bulk voltage ($V_{DB}$) of the transistor. FIG. 3 shows a plot 20 of leakage current in a CMOS transistor as a function of the drain-bulk voltage. Specifically, the horizontal axis shows increasing values of the drain-bulk voltage, from about 3 volts to about 3.9 volts. The vertical axis shows GIDL current with the transistor in the off state (e.g., $V_{GS}$ is zero or nearly zero), and the source-bulk voltage ($V_{SB}$) also zero or nearly zero. The numbers on the vertical axis are relative to a drain-bulk voltage of 3 volts.

As curve 23 of the GIDL current shows, decreasing the drain-bulk voltage ($V_{DB}$) results in a corresponding decrease in the GIDL current. For example, as curve 23 illustrates, decreasing the drain-bulk voltage even by ~500 mV can decrease GIDL substantially, say, by a factor of nearly 10. This property may be used to improve the GIDL current of various CMOS circuits, such as inverters, logic gates, level shifters, transmission gates, etc., as described below in detail.

Figure 4:
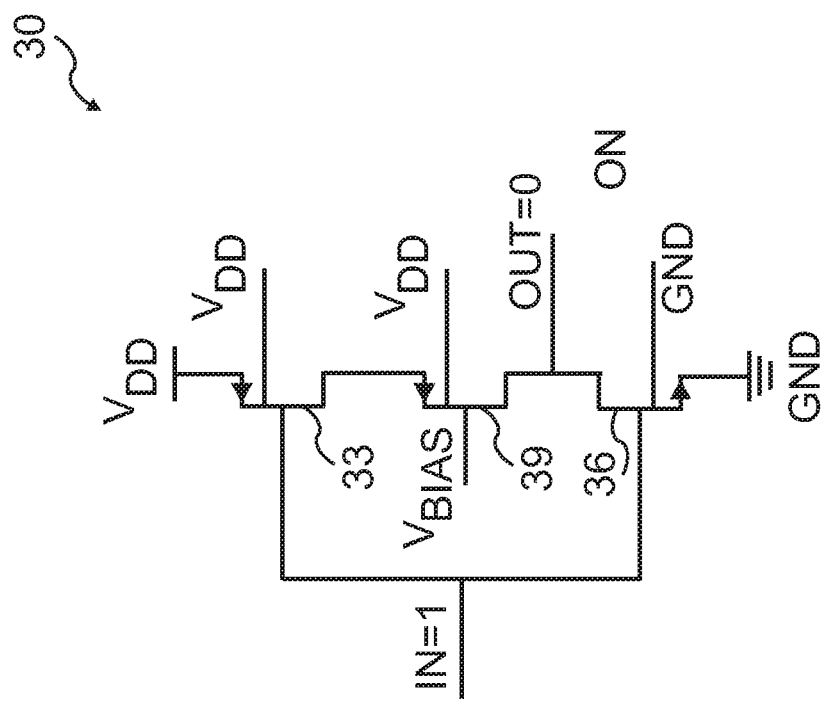
FIG. 4 depicts a circuit arrangement for an inverter with reduced leakage current according to an exemplary embodiment.

Generally speaking, CMOS circuits according to exemplary embodiments employ techniques to reduce the drain-bulk voltage ($V_{DB}$) seen by or applied to a leaking device, such as an LDD PMOS or NMOS transistor. In some embodiments, an additional PMOS transistor is coupled to a pull-up transistor (e.g., the pull-up PMOS transistor of a CMOS inverter). FIG. 4 depicts a circuit arrangement 30 for an inverter with reduced leakage current according to an exemplary embodiment.

Specifically, the inverter in FIG. 4 includes pull-up PMOS transistor 33 and pull-down NMOS transistor 36. In addition, the inverter includes GIDL current reduction PMOS transistor 39, coupled between transistor 33 and the output node (OUT) of the inverter. More specifically, the source of transistor 39 is coupled to the drain of transistor 33, whereas the drain of transistor 39 is coupled to the output node of the inverter.

Transistor 39 acts to reduce the effective drain-bulk voltage ($V_{DB}$) of transistor 33 (the drain-bulk voltage seen by transistor 33 when it is in the off state). To facilitate this operation, the bulk or body of transistor 39 is coupled to the supply voltage ($V_{DD}$) and the gate of transistor 39 is coupled to a bias voltage ($V_{bias}$). The bias voltage is selected so as to cause a voltage drop across transistor 39, thus reducing the effective drain-bulk voltage of transistor 33. The reduction of the drain-bulk voltage of transistor 33 causes a reduction in the GIDL current attributable to transistor 33.

Note that, in some embodiments, rather than including transistor 39 in series with transistor 33, a GIDL current reduction NMOS transistor may be added in series with transistor 36. The gate of such a transistor would be coupled to a bias source of appropriate value in order to decrease the drain-bulk voltage of transistor 36. The reduction in the drain-bulk voltage of transistor 36 would cause a reduction in the GIDL current attributable to transistor 36. Furthermore in some embodiments, both a GIDL current reduction PMOS transistor and a GIDL current reduction NMOS transistor may be used, as described below, for example, in connection with FIG. 8.

Figure 5:
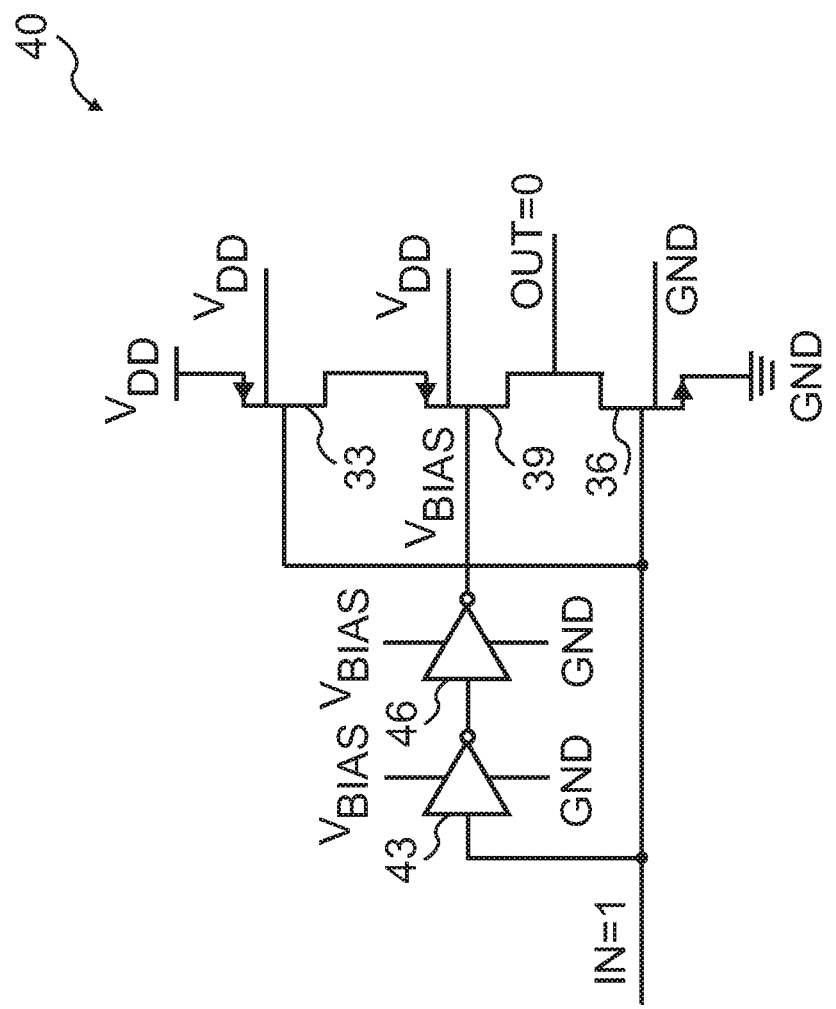
FIG. 5 illustrates one state of a circuit arrangement for an inverter with reduced leakage current according to an exemplary embodiment.

One aspect of the disclosure relates to generation of the bias voltage used to reduce leakage current, such as $V_{bias}$ shown in FIG. 4. FIG. 5 illustrates one state of a circuit arrangement 40 for providing a bias voltage to a CMOS logic circuit (an inverter, in the example shown). Circuit arrangement 40 includes an inverter 43 coupled in cascade with an inverter 46. Inverter 43 and inverter 46 receive supply voltage from a voltage source labeled "$V_{BIAS}$." Thus, for CMOS inverters, the output voltages of inverter 43 and inverter 46 varies in the range of $V_{SS}$ (typically ground potential) and the supply voltage, $V_{BIAS}$.

FIG. 5 illustrates the situation where the input voltage has a logic 1 value=1). In this case, the output of inverter 43 has a logic 0 value, which results in the output of inverter 46 having a logic 1 value (labeled "$V_{BIAS}$"). The output of inverter 46 provides the bias voltage to GIDL current reduction PMOS transistor 39. Thus, for a logic 1 input value, inverter 46 provides a bias voltage of $V_{BIAS}$.

Figure 6:
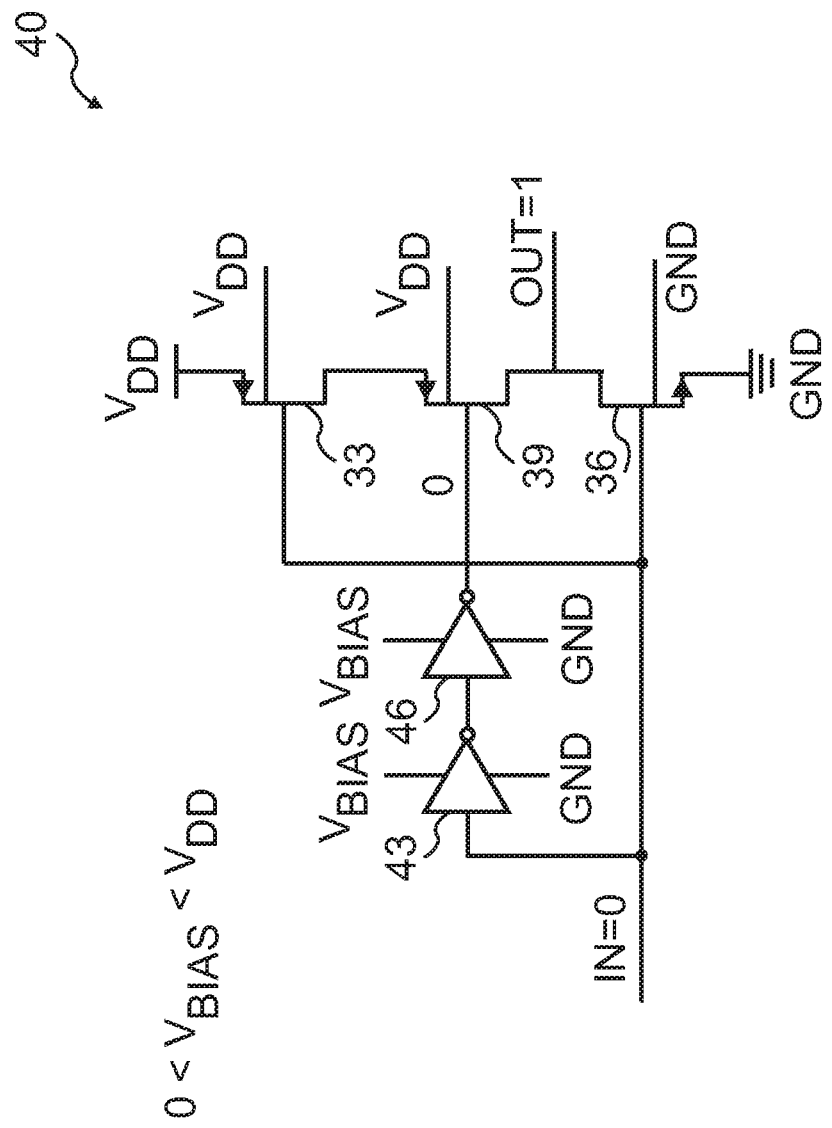
FIG. 6 depicts another state of a circuit arrangement for an inverter with reduced leakage current according to an exemplary embodiment.

FIG. 6 shows the situation where the input voltage has a logic 0 value (IN=0). In this situation, the output of inverter 43 has a logic 1 value, which results in the output of inverter 46 having a logic 0 value (labeled "0"). The output of inverter 46 provides the bias voltage to GIDL current reduction PMOS transistor 39. Thus, for a logic 0 input value, inverter 46 provides a bias voltage of 0 volts (ground potential).

As FIGS. 5-6 illustrate, using inverter 43 and inverter 46 provides a mechanism for providing a bias voltage that varies in response to the input signal to a CMOS logic circuit. In other words, the bias voltage provided is adaptive, in that it adapts in response to the values of the input voltage applied to the CMOS logic circuit. Note that a similar arrangement may be applied to situations where a GIDL current reduction NMOS transistor is added in series with transistor 36 (described above), or in the case where both a GIDL current reduction PMOS transistor and a GIDL current reduction NMOS transistor are used (described above).

Figure 7:
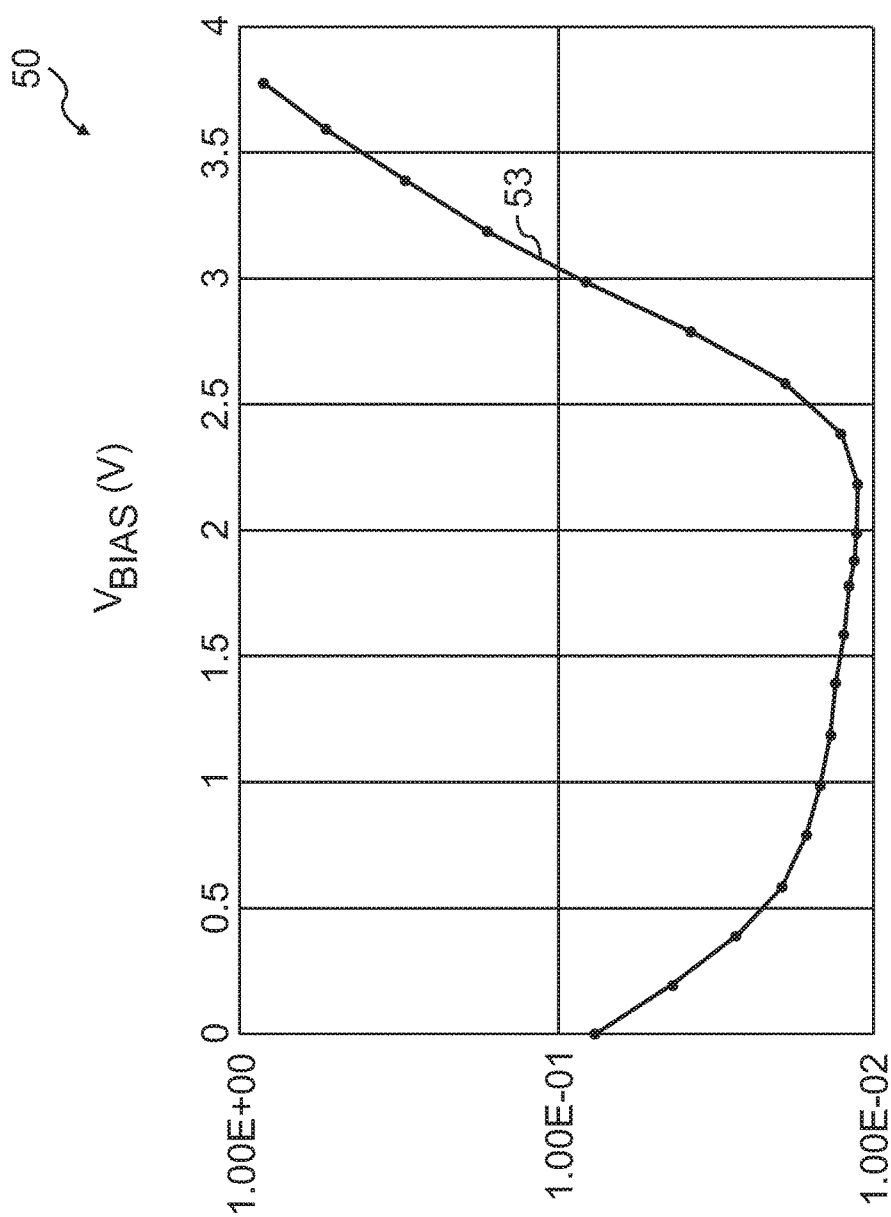
FIG. 7 illustrates a plot of leakage current as a function of bias voltage according to an exemplary embodiment.

One aspect of the disclosure relates to providing one or more variable (or configurable or adjustable or programmable) bias voltages to one or more CMOS logic circuits in order to reduce GIDL current. FIG. 7 illustrates a plot 50 of leakage current as a function of bias voltage according to an exemplary embodiment. Plot 50 includes curve 53, which shows results of simulation of GIDL current as a function of bias voltage (labeled "$V_{BIAS}$"). More specifically, curve 53 provides the results for a CMOS inverter with a supply voltage of 3.8 volts, and is normalized to a regular CMOS inverter (i.e., with no GIDL current reduction) when $V_{BIAS}$ is swept between the ground potential (0 volts) and the supply voltage ($V_{DD}$).

As FIG. 7 illustrates, GIDL current is optimized when the bias voltage has a value close to half of the supply voltage, i.e., $V_{BIAS} \approx \frac{1}{2} V_{DD}$. Thus, in some embodiments, a bias voltage is used with a value of half the supply voltage, or near half of the supply voltage (e.g., substantially equal to half the supply voltage, for example, within 5%, 10%, or 20% of the supply voltage, etc.). Note that such bias voltages may be applied to GIDL current reduction PMOS transistor (s) and/or GIDL current reduction NMOS transistor(s), as desired.

For basic logic gates, such as an inverter, a simpler option is to use fixed bias voltages. For instance, in some embodiments, a bias voltage of 0 volts (ground potential) is used for GIDL current reduction PMOS transistor(s), and/or the supply voltage (VDD) is used as a bias voltage GIDL current reduction NMOS transistor(s). This scheme provides a tradeoff between circuit complexity and performance, for instance, compared to bias voltages with arbitrary or variable values.

Figure 8:
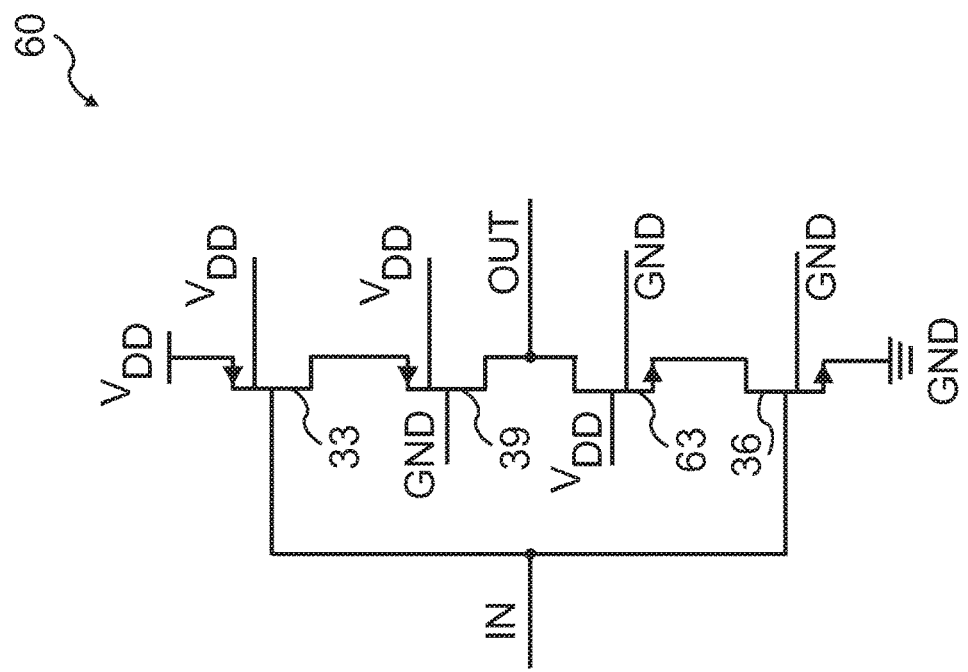
FIG. 8 shows a circuit arrangement for an inverter with reduced leakage current according to an exemplary embodiment.

As noted above, in some embodiments, both GIDL current reduction PMOS transistor(s) and GIDL current reduction NMOS transistor(s) are used. FIG. 8 shows a circuit arrangement 60 for a CMOS inverter that uses this configuration.

More specifically, the inverter in FIG. 8 includes pull-up PMOS transistor 33 and pull-down NMOS transistor 36. The inverter also includes GIDL current reduction PMOS transistor 39, coupled between transistor 33 and the output node (OUT) of the inverter. More specifically, the source of transistor 39 is coupled to the drain of transistor 33, whereas the drain of transistor 39 is coupled to the output node of the inverter.

Transistor 39 acts to reduce the effective drain-bulk voltage ($V_{DB}$) of transistor 33 (the drain-bulk voltage seen by transistor 33 when it is in the off state). To facilitate this operation, the bulk or body of transistor 39 is coupled to the supply voltage ($V_{DD}$) and the gate of transistor 39 is coupled to a bias voltage which, in the embodiment shown, is ground potential. The bias voltage is selected so as to reduce the effective drain-bulk voltage of transistor 33. The reduction of the drain-bulk voltage of transistor 33 causes a reduction in the GIDL current attributable to transistor 33.

The inverter also includes GIDL current reduction NMOS transistor 63, coupled between transistor 36 and the output node (OUT) of the inverter. More specifically, the source of transistor 63 is coupled to the drain of transistor 36, whereas the drain of transistor 63 is coupled to the output node of the inverter.

Transistor 63 acts to reduce the effective drain-bulk voltage ($V_{DB}$) of transistor 36 (the drain-bulk voltage seen by transistor 36 when it is in the off state). To facilitate this operation, the bulk or body of transistor 63 is coupled to the ground potential and the gate of transistor 63 is coupled to a bias voltage which, in the embodiment shown, is the supply voltage ($V_{DD}$). The bias voltage is selected so as to reduce the effective drain-bulk voltage of transistor 36. The reduction of the drain-bulk voltage of transistor 36 causes a reduction in the GIDL current attributable to transistor 36.

Note that, as discussed above, circuit arrangement 60 uses fixed bias voltages, i.e., ground potential coupled to the gate of transistor 39, and the supply voltage coupled to the gate of transistor 63. In other embodiments, however, the bias voltage applied to transistor 39 and/or the bias voltage applied to transistor 63 may be variable (or configurable or adjustable or programmable), as discussed above.

Figure 9:
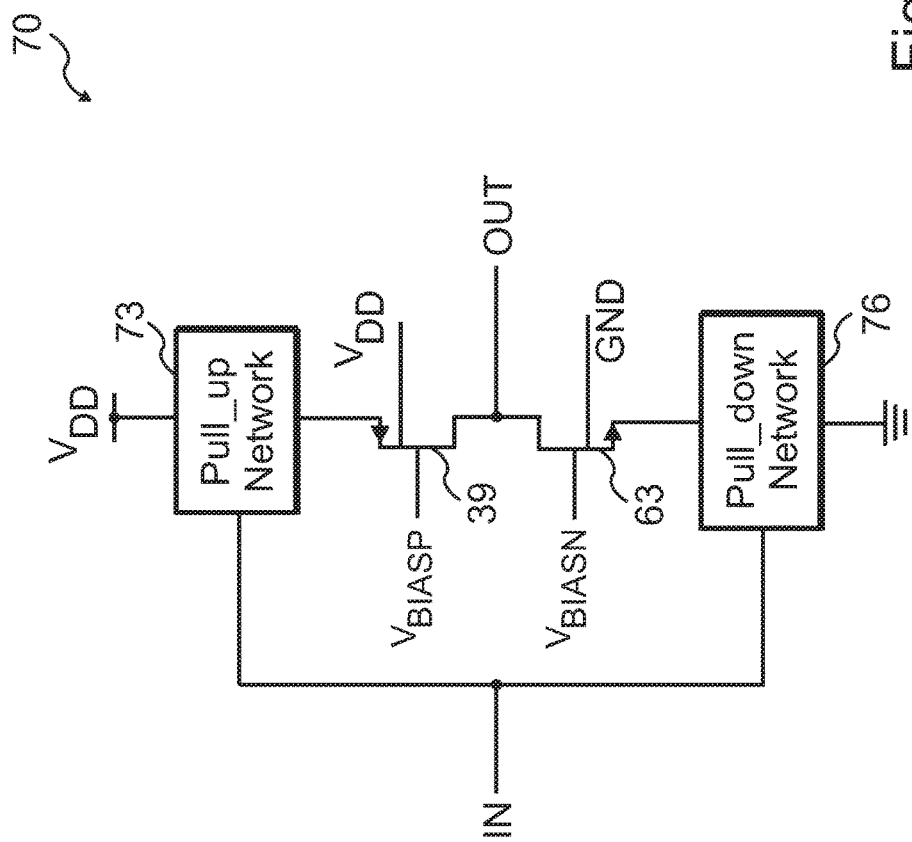
FIG. 9 illustrates a circuit arrangement for a CMOS circuit with reduced leakage current according to an exemplary embodiment.

The use of GIDL current reduction PMOS transistor 39 and/or GIDL current reduction NMOS transistor 63 may be applied generally to various CMOS circuits. FIG. 9 illustrates a circuit arrangement 70 for a CMOS circuit with reduced leakage current according to an exemplary embodiment. The bulk or body nodes of PMOS transistors and the bulk and body nodes of NMOS transistors in circuit arrangement 70 are coupled to the supply voltage ($V_{DD}$) and ground potential ($V_{SS}$), respectively.

Circuit arrangement 70 includes pull-up network 73, which is coupled to receive the supply voltage ($V_{DD}$) and one or more inputs (labeled "IN") of the CMOS circuit. Note that not all transistors in pull-up network 73 are necessarily coupled to the supply voltage or the input(s). Pull-up network 73 typically includes one or more PMOS transistors.

Similar to the inverter shown in FIG. 8, GIDL current reduction PMOS transistor 39 in FIG. 9 is coupled between pull-up network 73 and the output node (labeled "OUT") of the CMOS circuit. The bulk or body of transistor 39 is coupled to the supply voltage ($V_{DD}$). The gate of transistor 39 is coupled to a bias voltage $V_{BIASP}$, which may be fixed or variable (or configurable or adjustable or programmable), as described above.

Furthermore, the CMOS circuit in FIG. 9 includes a pull-down network, which is coupled to the ground potential and to one or more inputs (labeled "IN") of the CMOS circuit. Note that not all transistors in pull-down network 76 are necessarily coupled to the ground potential or the input(s).

Similar to the inverter shown in FIG. 8, GIDL current reduction NMOS transistor 63 in FIG. 9 is coupled between pull-down network 76 and the output node (labeled "OUT") of the CMOS circuit. The bulk or body of transistor 63 is coupled to the ground potential or $V_{SS}$. The gate of transistor 63 is coupled to a bias voltage $V_{BIASN}$, which may be fixed or variable (or configurable or adjustable or programmable), as described above.

Note that in some embodiments, the bias voltages $V_{BIASP}$ and $V_{BIASN}$ might be the same, for example, one half of the supply voltage, as described above. In other embodiments, however, the bias voltages $V_{BIASP}$ and $V_{BIASN}$ might different values.

The use of GIDL current reduction PMOS transistor 39 and GIDL current reduction NMOS transistor 63 reduces the drain-bulk voltage ($V_{DB}$) seen by or applied to the transistor(s) in pull-up network 73 and/or pull-down network 76, as described above. As a result, the GIDL current in the CMOS circuit is reduced.

Note that, rather than using both GIDL current reduction PMOS transistor 39 and GIDL current reduction NMOS transistor 63, in some embodiments one or the other transistor is used to reduce GIDL current in the CMOS circuit. More specifically, in some embodiments, the CMOS circuit includes pull-up network 73 coupled to GIDL current reduction PMOS transistor 39, and a pull-down network 76 (in other words, GIDL current reduction NMOS transistor 63 is omitted). Conversely, in some embodiments, the CMOS circuit includes pull-down network 76 coupled to GIDL current reduction NMOS transistor 63, and a pull-up network 73 (in other words, GIDL current reduction PMOS transistor 39 is omitted).

Referring again to FIG. 9, as persons of ordinary skill in the art will understand, pull-up network 73 and pull-down network 76 include one or more MOSFETs. More specifically, in exemplary embodiments, pull-up network 73 includes one or more PMOS transistors. Conversely, pull-down network 76 includes one or more NMOS transistors.

Figure 10:
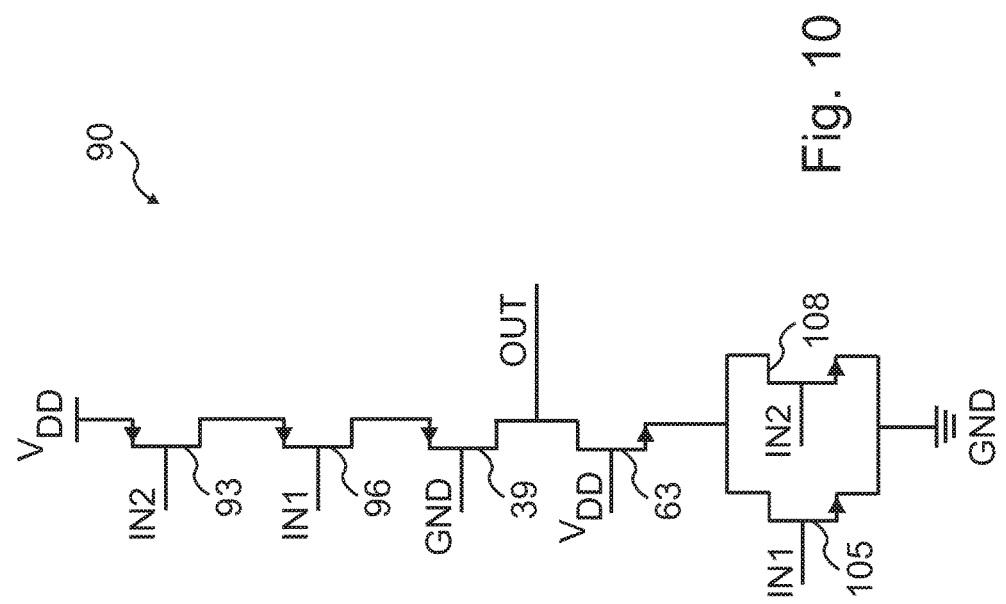
FIG. 10 depicts a circuit arrangement for a NAND gate with reduced leakage current according to an exemplary embodiment.

The configuration of the transistors in pull-up network 73 and pull-down network 76 determines the overall logic function that the CMOS circuit performs. For example, FIG. 10 depicts a circuit arrangement 90 for a NAND gate with reduced leakage current according to an exemplary embodiment.

The pull-up network in the NAND gate includes transistor 93 coupled to receive input IN2 and transistor 96 coupled to receive input IN1 of the NAND gate. GIDL current reduction PMOS transistor 39 is coupled between transistor 96 and the output node (labeled "OUT") of the NAND gate. The gate of transistor 39 is biased by the ground potential, although other bias voltages may be used, as described above.

Conversely, the pull-down network in the NAND gate includes transistor 105 coupled to receive input IN1 and transistor 108 coupled to receive input IN2 of the NAND gate. GIDL current reduction NMOS transistor 63 is coupled between transistors 105 and 108 and the output node (labeled "OUT") of the NAND gate. The gate of transistor 63 is biased by the supply voltage ($V_{DD}$), although other bias voltages may be used, as described above.

Figure 11:
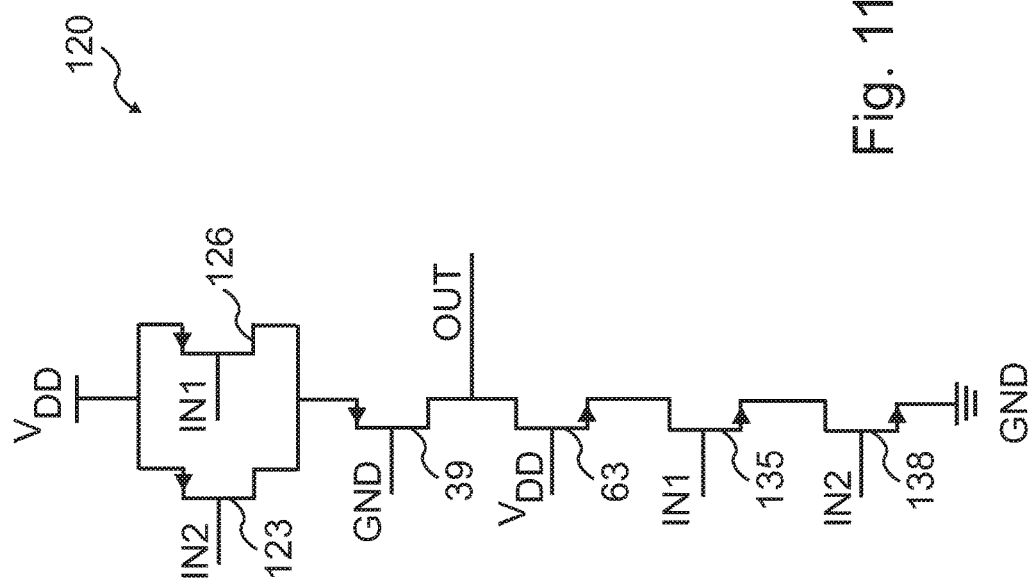
FIG. 11 shows a circuit arrangement for a NOR gate with reduced leakage current according to an exemplary embodiment.

FIG. 11 shows a circuit arrangement 120 for a NOR gate with reduced leakage current according to an exemplary embodiment. The pull-up network in the NOR gate includes transistor 126 coupled to receive input IN1 and transistor 123 coupled to receive input IN2 of the NOR gate. GIDL current reduction PMOS transistor 39 is coupled between transistors 123 and 126 and the output node (labeled "OUT") of the NOR gate. The gate of transistor 39 is biased by the ground potential, although other bias voltages may be used, as described above.

Conversely, the pull-down network in the NOR gate includes transistor 135 coupled to receive input IN1 and transistor 138 coupled to receive input IN1 of the NOR gate. GIDL current reduction NMOS transistor 63 is coupled between transistor 135 and the output node (labeled "OUT") of the NOR gate. The gate of transistor 63 is biased by the supply voltage ($V_{DD}$), although other bias voltages may be used, as described above.

One aspect of the disclosure relates to reducing GIDL current in CMOS transmission gates. FIGS. 12-15 illustrate leakage mechanisms in various states of a CMOS transmission gate 150. Transmission gate 150 includes NMOS transistor 153 and PMOS transistor 156, coupled to the input (labeled "IN") and output (labeled "OUT") nodes. In response to the enable signal (labeled "EN") and the logical complement of the enable signal (labeled "ENB"), transistor 153 either couple the input to the output (when transmission gate 150 is on) or isolate the input from the output (when transmission gate 150 is off).

Transmission gate 150 includes multiple paths where GIDL currents flow when EN=0 (i.e., ENB=1, and transmission gate 150 is off), depending on the state of the input and output signals, i.e., "IN" and "OUT." FIGS. 12-15 show paths 18 through which the leakage current flows, depending on the states of the input and output signals, as Table 1 below indicates:

TABLE 1

| FIG. | EN | ENB | IN | OUT |
|---|---|---|---|---|
| 12 | 0 | 1 | 0 | 0 |
| 13 | 0 | 1 | 1 | 0 |
| 14 | 0 | 1 | 0 | 1 |
| 15 | 0 | 1 | 1 | 1 |

Figure 16:
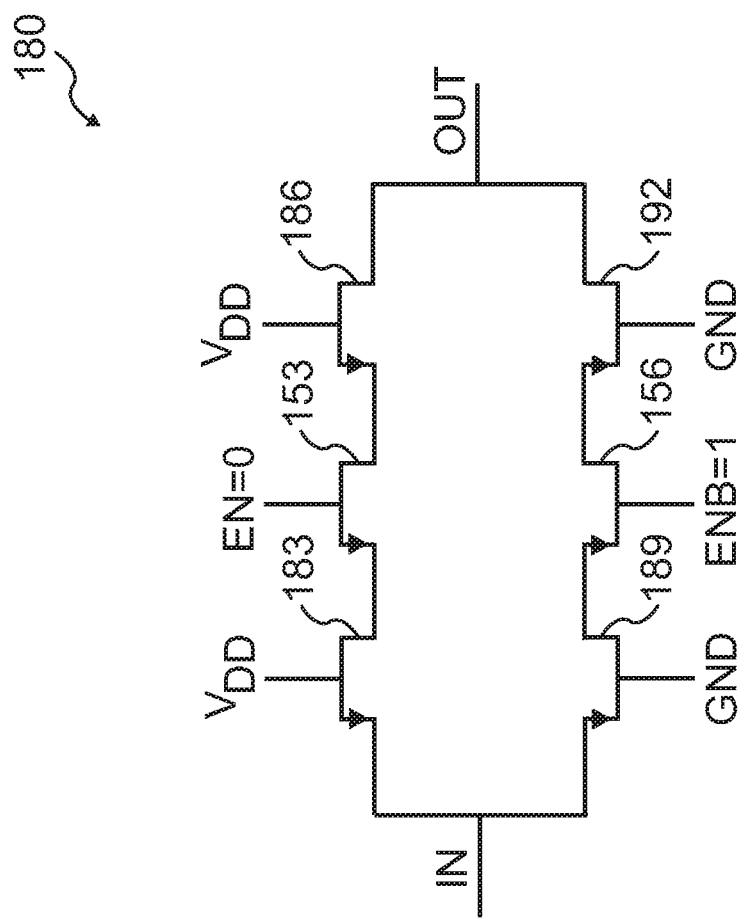
FIG. 16 depicts a transmission gate with reduced leakage current according to an exemplary embodiment.

GIDL current reduction transistors may be used to reduced the leakage current of CMOS transmission gates. FIG. 16 depicts a circuit arrangement 180 for a transmission gate with reduced leakage current according to an exemplary embodiment. The transmission gate includes transistor 153, driven by the EN signal, and transistor 156, driven by the ENB signal.

In addition, the transmission gates includes GIDL current reduction NMOS transistors 183 and 186. Transistor 183 is coupled between the input of the transmission gate and transistor 153. Conversely, transistor 186 is coupled between the output of the transmission gate and transistor 153. The gates of transistors 183 and 186 are coupled to a bias voltage, $V_{DD}$, in the example shown, although other bias voltage values may be used, as discussed above.

The transmission gate further includes GIDL current reduction PMOS transistors 189 and 192. Transistor 189 is coupled between the input of the transmission gate and transistor 156. Conversely, transistor 192 is coupled between the output of the transmission gate and transistor 156. The gates of transistors 189 and 192 are coupled to a bias voltage, the ground potential in the example shown, although other bias voltage values may be used, as discussed above.

The bulk or body regions of the NMOS transistors in the transmission gate are coupled to the ground potential. The bulk or body regions of the PMOS transistors in the transmission gate are coupled to the supply voltage ($V_{DD}$).

Figure 17:
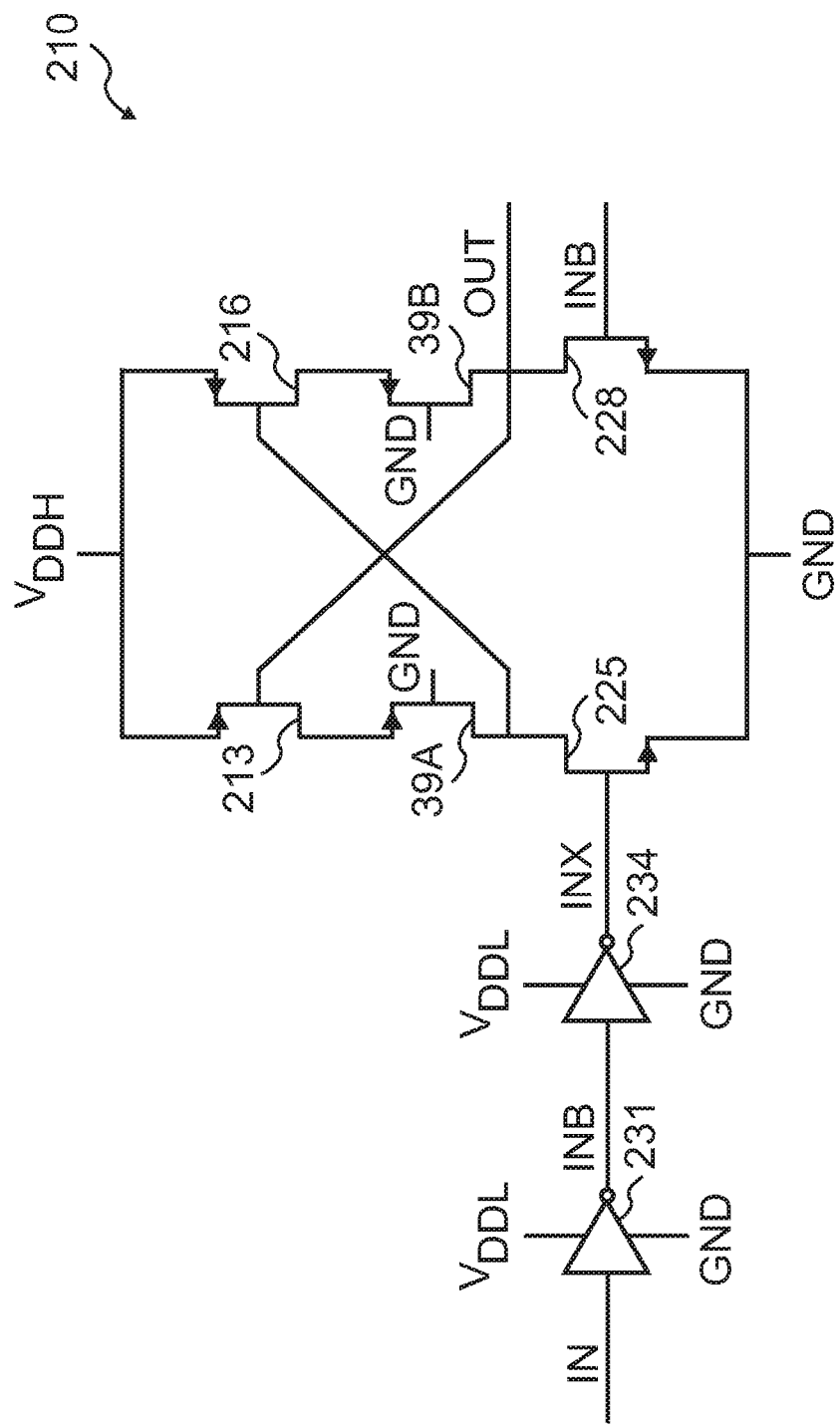
FIG. 17 shows a circuit arrangement for a level shifter according to an exemplary embodiment.

One aspect of the disclosure relates reducing GIDL current in CMOS level shifters. FIG. 17 shows a circuit arrangement 210 for a level shifter according to an exemplary embodiment. The level shifter constitutes a low-to-high level shifter, and includes GIDL current reduction circuitry.

The level shifter includes inverter 231 coupled in cascade with inverter 234. The cascade of the two inverters buffers the input voltage (labeled "IN"). The output of inverter 231 (labeled "INB") drives the gate of transistor 228. The output of inverter 234 (labeled "INX") drives the gate of transistor 225.

Transistor 225 is cross-coupled with transistor 216. More specifically, the drain of transistor 225 is coupled to the gate of transistor 216. Similarly, transistor 228 is cross-coupled with transistor 213. Thus, the drain of transistor 228 is coupled to the gate of transistor 216.

Inverter 231 and inverter 234 use a power supply voltage $V_{DDL}$. Transistors 213 and 216 are coupled to a supply voltage $V_{DDH}$. The supply voltage $V_{DDH}$ has a larger value than the supply voltage $V_{DDL}$. Thus, the output of the level shifter, at the drain of transistor 228, can drive follow-on circuitry (not shown) supplied by supply voltage $V_{DDH}$.

Note that the gates of transistors 225 and 228 are driven by inverters 231 and 234, respectively, which are supplied power from $V_{DDL}$, a relatively low supply voltage (compared to $V_{DDH}$). With respect to transistor 213 and transistor 216, the level shifter includes additional circuitry to reduce the GIDL current of transistors 213 and 216. More specifically, the level shifter includes GIDL current reduction PMOS transistor 39A, coupled between transistor 213 and transistor 225. The source of transistor 39A is coupled to the drain of transistor 213. The drain of transistor 39A is coupled to the drain of transistor 225.

The gate of transistor 39A is coupled to the ground potential. The addition of transistor 39A reduces the drain-bulk voltage ($V_{DB}$) seen by or applied to transistor 213 in its off state. As a result, the GIDL current contribution from transistor 213 is reduced.

Similarly, the level shifter includes GIDL current reduction PMOS transistor 39B, coupled between transistor 216 and transistor 228. The source of transistor 39B is coupled to the drain of transistor 216. The drain of transistor 39B is coupled to the drain of transistor 228.

The gate of transistor 39B is coupled to the ground potential. The addition of transistor 39B reduces the drain-bulk voltage ($V_{DB}$) seen by or applied to transistor 216 in its off state. As a result, the GIDL current contribution from transistor 216 is reduced.

The bulk or body regions of NMOS transistors 225 and 228 are coupled to ground potential. The bulk or body regions of PMOS transistors 213, 216, 39A, and 39B are coupled to the supply voltage $V_{DDH}$.

Figure 18:
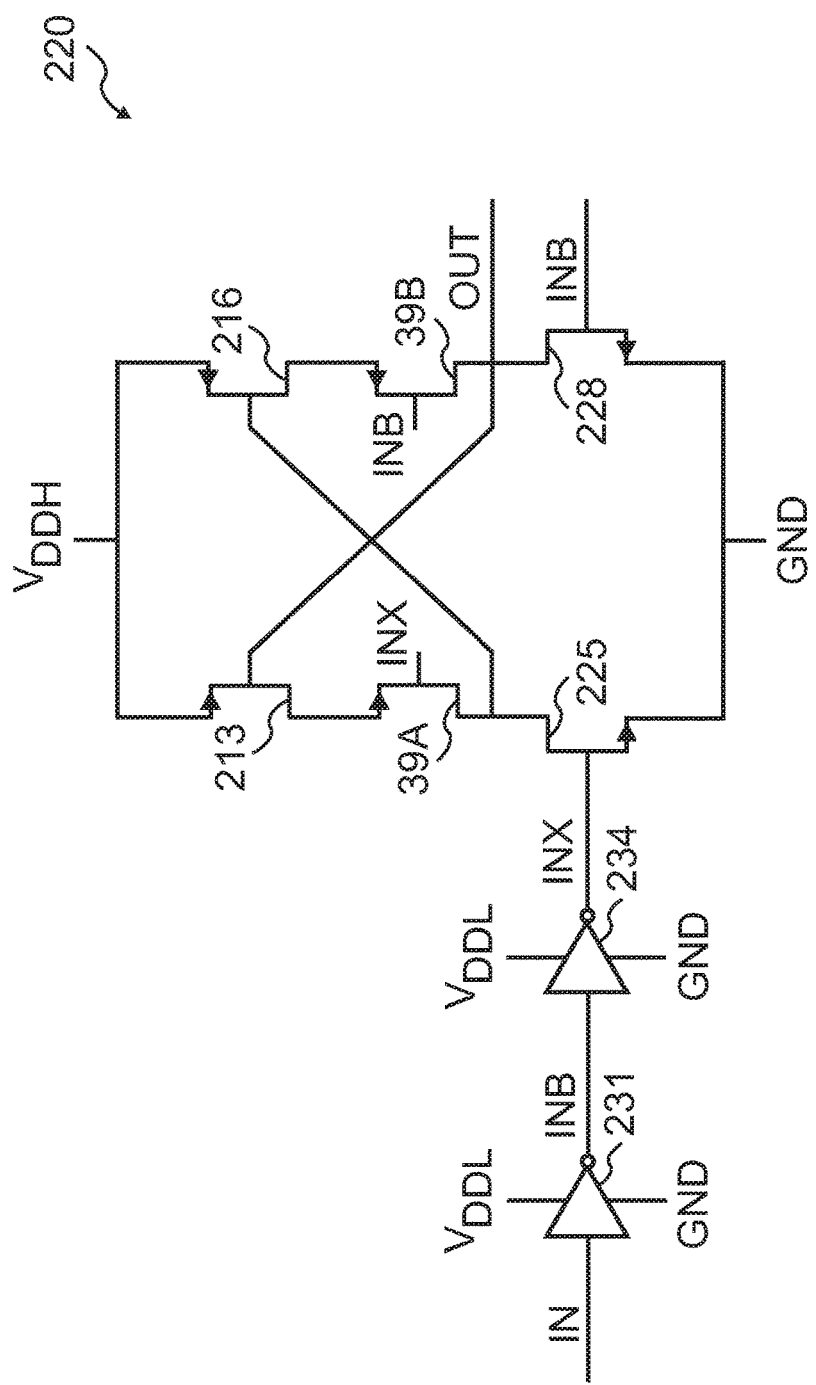
FIG. 18 illustrates a circuit arrangement for a level shifter according to another exemplary embodiment.

FIG. 18 illustrates a circuit arrangement 220 for a level shifter according to another exemplary embodiment. The level shifter in FIG. 18 is similar to and operates similarly to the level shifter in FIG. 17, with the exception of the bias voltages applied to transistors 39A and 39B. The level shifter in FIG. 18, however, uses an intermediate voltage ($V_{DDL}$) available in the circuit in order to further reduce the GIDL current.

More specifically, the gate of transistor 39A is coupled to the voltage "INX" (described above) i.e., the voltage "INX" serves as a bias voltage for transistor 39A. Similarly, the gate of transistor 39B is coupled to the voltage "INB" (described above) i.e., the voltage "INB" serves as a bias voltage for transistor 39B.

When the input voltage (IN) has a logic 1 value, the output voltage also has a logic 1 value. Transistor 213 is in the off state in this scenario. Given that the voltage "INX" has the same (or nearly same, accounting for non-ideal characteristics of a practical implementation) voltage as the supply voltage $V_{DDL}$, the drain of transistor 213 is maintained at a voltage level of $V_{DDL}$ plus the threshold voltage of transistor 39A, thus reducing the drain-bulk voltage ($V_{DB}$) of transistor 213 and, hence, its GIDL current contribution.

A similar analysis applies to transistors 39B and 216. In this case, the gate of transistor 39B is biased by the voltage "INB" which, similar to the voltage "INX," has the same (or nearly same, accounting for non-ideal characteristics of a practical implementation) voltage as the supply voltage $V_{DDL}$. Consequently, the drain-bulk voltage ($V_{DB}$) of transistor 216 and, hence, its GIDL current contribution are reduced.

The circuitry and techniques described above can be used to reduce the GIDL current of various CMOS circuitry. Simulation has shown that the GIDL current reduction may range 2 to 15 times in exemplary embodiments, depending on supply voltage, the bias voltage(s) used, and the type of logic gate.

Figure 19:
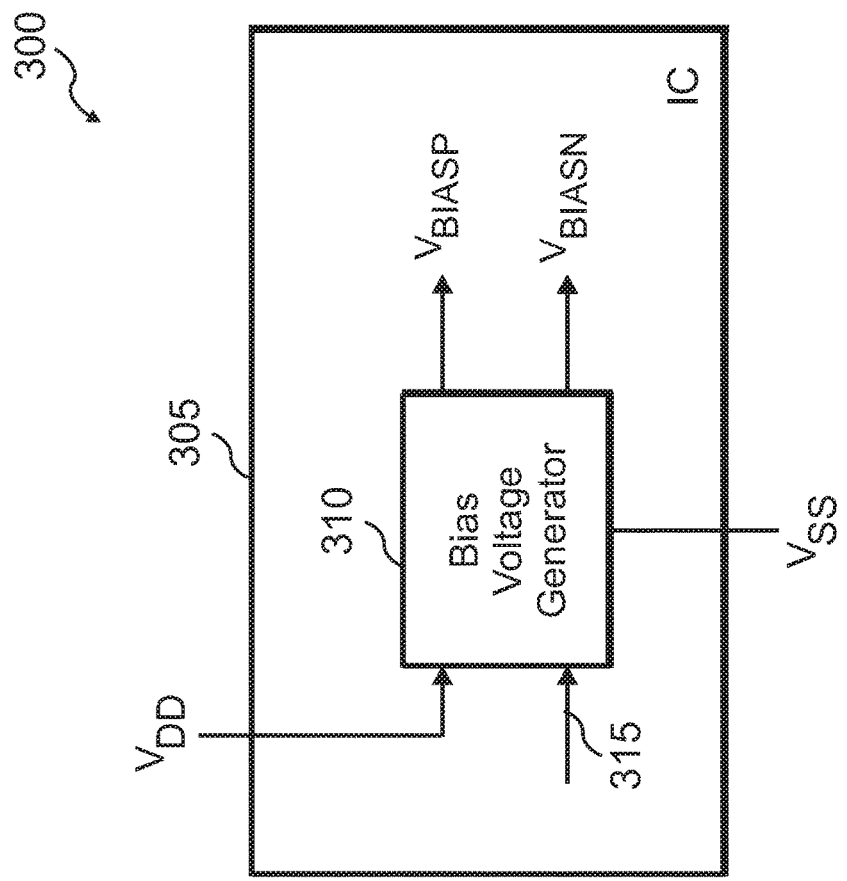
FIG. 19 depicts a circuit arrangement for reducing leakage current according to an exemplary embodiment.

One aspect of the disclosure relates to the generation of bias voltages in response to variables such as supply voltage. FIG. 19 depicts a circuit arrangement 300 for reducing leakage current according to an exemplary embodiment.

Circuit arrangement 300 includes an IC 305, which receives a supply voltage $V_{DD}$. The supply voltage $V_{DD}$ is provided to bias voltage generator 310. As noted above, the magnitude of the GIDL current for a given CMOS circuit depends in part on the supply voltage used. In response to the level of the supply voltage $V_{DD}$, generates a bias voltage $V_{BIASP}$ for GIDL current reduction PMOS transistor(s) (not shown) in the IC. Similarly, in response to the level of the supply voltage $V_{DD}$, generates a bias voltage $V_{BIASN}$ for GIDL current reduction PMOS transistor(s) (not shown) in the IC. The bias voltages $V_{BIASP}$ and $V_{BIASN}$ are used in CMOS circuitry (not shown) in the IC to reduce GIDL current, as described above.

Optionally, bias voltage generator 310 may respond to one or more input signals 315. More specifically, bias voltage generator 310 in some embodiments generates the bias voltages $V_{BIASP}$ and $V_{BIASN}$ depending on the level or type of input signal(s) 315. In some embodiments, one or more signals may be used to control the level of bias voltage(s) that bias voltage generator 310 generates.

For example, one or more signals may be used to control whether bias voltage generator 310 generates fixed or variable bias voltage(s). As another example, one or more signals may be used to control the level of change in the bias voltage(s) in response to a given amount of change in one or more variables, for instance, the amount of change in the supply voltage $V_{DD}$. As another example, one or more control signals may be used to control whether one or another set of fixed bias voltages is used (for instance, $V_{DD}$ and ground potential are used as $V_{BIASP}$ and $V_{BIASN}$, respectively, or $½V_{DD}$ is used for both $V_{BIASP}$ and $V_{BIASN}$). As another example, one or more control signals may be used to control whether one or both of bias voltages $V_{BIASP}$ and $V_{BIASN}$ is variable (e.g., one fixed bias voltage and one variable bias voltage, both fixed bias voltages, or both variable bias voltages).

Other variations in the configuration and control of bias voltage generator 310 are possible and contemplated, as persons of ordinary skill in the art will understand. The choice of configuration and control of bias voltage generator 310 in a given implementation depends on a variety of factors, as persons of ordinary skill in the art will understand. Such factors include design specifications, performance specifications, the level of GIDL current reduction desired, circuit complexity, cost, IC or device area, available technology, such as semiconductor fabrication technology, target markets, target end-users, etc.

Note that in some embodiments, rather than providing two bias voltages, bias voltage generator 310 may generate one bias voltage. For example, in some embodiments, generator 310 may generate $V_{BIASP}$ but not $V_{BIASN}$. As another example, in some embodiments, generator 310 may generate $V_{BIASN}$ but not $V_{BIASP}$. The choice of the number of bias voltages depends on whether GIDL current reduction PMOS transistor(s), GIDL current reduction NMOS transistor(s), or both are used in a CMOS circuit.

Bias voltage generator 310 may be implemented in a variety of ways. In some embodiments, a control circuit may be used to control the operation of bias voltage generator 310. In some embodiments, an analog circuit (e.g., an amplifier or scaling circuit) may be used to implement the generation of bias voltage(s) in response to the level of the supply voltage $V_{DD}$. Generally, either analog circuitry or mixed-signal circuitry may be used to implement bias voltage generator 310, depending on factors such as design specifications, performance specifications, the level of GIDL current reduction desired, circuit complexity, cost, IC or device area, available technology, such as semiconductor fabrication technology, target markets, target end-users, etc., as persons of ordinary skill in the art will understand.

Figure 20:
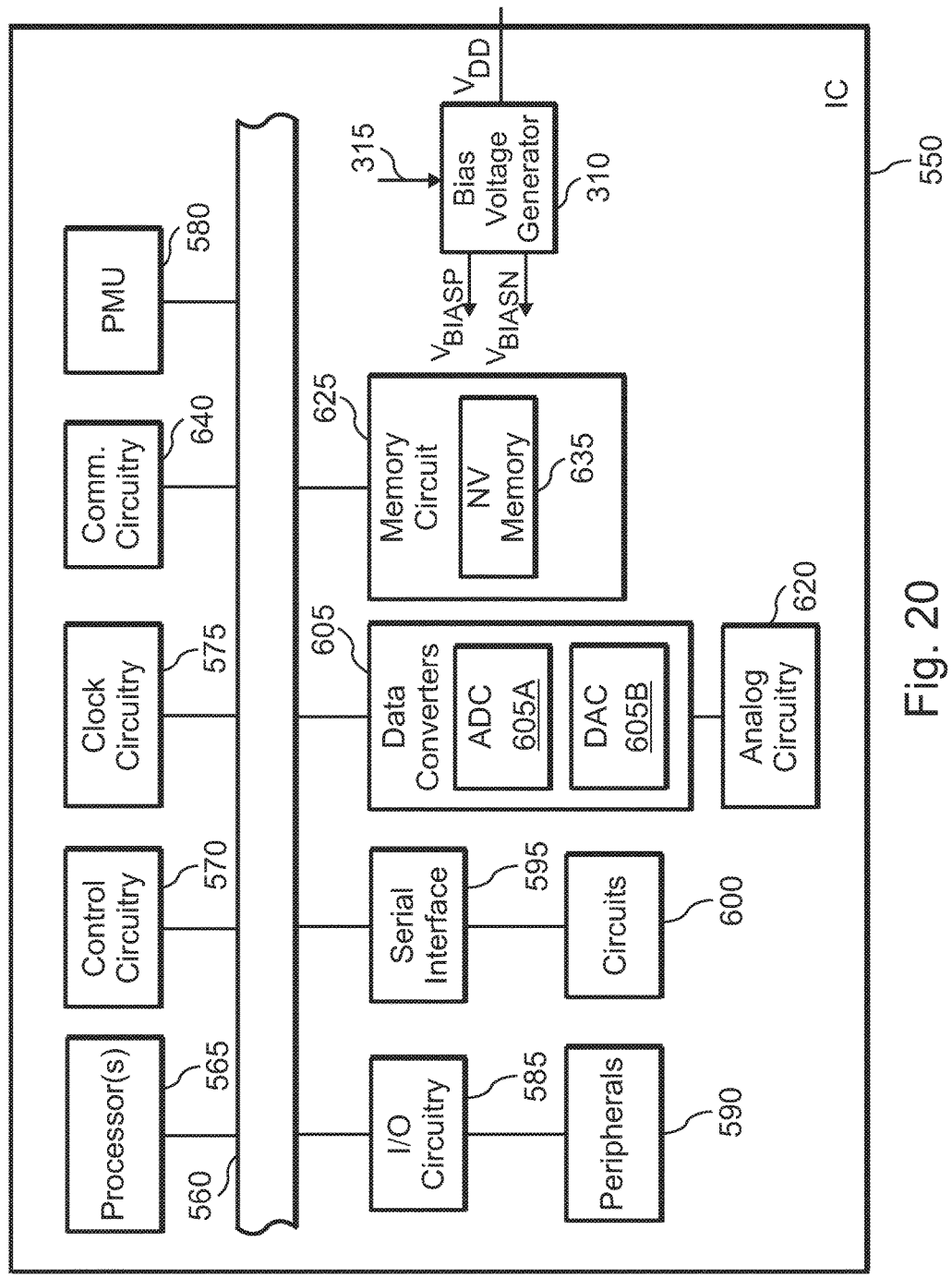
FIG. 20 shows a block diagram of an IC according to another exemplary embodiment.

As noted, GIDL current reduction circuitry according to various embodiments may be used in a variety of circuitry, such as ICs. FIG. 20 shows a block diagram of an IC 550 according to another exemplary embodiment. In the particular example shown, IC 550 includes or constitutes a microcontroller unit (MCU), although other types of circuitry or IC may be used, as persons of ordinary skill in the art will understand.

Referring to FIG. 20, IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 605B and/or one or more DACs 605A. The ADC(s) 615 receive analog signal(s) from analog circuitry 620, and convert the analog signal(s) to a digital format, which they communicate to one or more blocks coupled to link 560.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks, and information processing blocks, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580 to reset to an initial state. In some embodiments, the functionality and/or circuitry (or part thereof) of bias voltage generator 310 may be included in control circuitry 570, as desired.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown). NV memory 635 may be used for storing information related to performance or configuration of one or more blocks in IC 550. For example, NV memory 635 may store configuration information related to the operation of bias voltage generator 310, such as the degree of change in the level of bias voltage(s) in response to change, for example, in the level of the supply voltage, as described above.

IC 550 also includes bias voltage generator 310. As discussed above, bias voltage generator 310 operates in response to the supply voltage $V_{DD}$ and, optionally, to input signal(s) 315. Bias voltage generator 310 generates bias voltage $V_{BIASP}$ and/or $V_{BIASN}$. The bias voltage(s) may be used to bias GIDL current reduction PMOS transistor(s) and/or GIDL current reduction NMOS transistor(s) used to reduce GIDL current, as described above. More specifically, the bias voltage(s) may be used to reduce GIDL current in one or more of the blocks of circuitry shown in IC 550 (or other desired circuitry), as described above.

Various circuits and blocks described above and used in exemplary embodiments may be implemented in a variety of ways and using a variety of circuit elements or blocks. For example, part of bias generator 310, pull-up network 73, and pull-down network 76 may generally be implemented using digital circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Various other circuits and blocks described above and used in exemplary embodiments may be implemented in a variety of ways and using a variety of circuit elements or blocks. For example, part of bias generator 310 or other mixed-signal circuitry (e.g., in IC 550 in FIG. 20) may generally be implemented using analog circuitry. The analog circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand. In addition, digital circuitry or mixed-signal circuitry or both may be included. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus comprising:
   an integrated circuit (IC) comprising:
   complementary metal oxide semiconductor (CMOS) circuitry comprising a pull-up network coupled to a supply voltage and at least one input signal; and
   a first metal oxide semiconductor (MOS) transistor coupled to the pull-up network and to a first bias voltage to reduce a gate-induced drain leakage (GIDL) current of the CMOS circuitry.

2. The apparatus according to claim 1, wherein the IC further comprises:
   a pull-down network coupled to a ground potential and to the at least one input signal; and
   a second MOS transistor coupled to the pull-down network and to a second bias voltage to reduce the GIDL current of the CMOS circuitry.

3. The apparatus according to claim 1, wherein the first bias voltage is applied to a gate of the first MOS transistor to reduce a drain-bulk voltage of at least one transistor in the pull-up network.

4. The apparatus according to claim 2, wherein the second bias voltage is applied to a gate of the second MOS transistor to reduce a drain-bulk voltage of at least one transistor in the pull-down network.

5. The apparatus according to claim 2, wherein at least one of the first and second bias voltages is variable.

6. The apparatus according to claim 1, wherein the first bias voltage depends on a supply voltage of the CMOS circuitry.

7. The apparatus according to claim 2, wherein the second bias voltage depends on a supply voltage of the CMOS circuitry.

8. An apparatus comprising:
   an integrated circuit (IC) comprising:
   complementary metal oxide semiconductor (CMOS) circuitry comprising a pull-down network coupled to a ground potential and at least one input signal; and
   a first metal oxide semiconductor (MOS) transistor coupled to the pull-down network and to first a bias voltage to reduce a gate-induced drain leakage (GIDL) current of the CMOS circuitry.

9. The apparatus according to claim 8, wherein the IC further comprises:
   a pull-up network coupled to a supply voltage and to the at least one input signal; and
   a second MOS transistor coupled to the pull-up network and to a second bias voltage to reduce the GIDL current of the CMOS circuitry.

10. The apparatus according to claim 8, wherein the first bias voltage is applied to a gate of the first MOS transistor to reduce a drain-bulk voltage of at least one transistor in the pull-down network.

11. The apparatus according to claim 9, wherein the second bias voltage is applied to a gate of the second MOS transistor to reduce a drain-bulk voltage of at least one transistor in the pull-up network.

12. The apparatus according to claim 9, wherein at least one of the first and second bias voltages is variable.

13. The apparatus according to claim 8, wherein the first bias voltage depends on a supply voltage of the CMOS circuitry.

14. The apparatus according to claim 9, wherein the second bias voltage depends on a supply voltage of the CMOS circuitry.

15. A method of reducing a gate-induced drain leakage (GIDL) current of at least one transistor in a complementary metal oxide semiconductor (CMOS) circuit, the method comprising biasing a metal oxide semiconductor (MOS) transistor coupled to the at least one transistor by applying a bias voltage to a gate of the MOS transistor so as to reduce a drain-bulk voltage of the at least one transistor.

16. The method according to claim 15, wherein the at least one transistor is included in a pull-up network of the CMOS circuit.

17. The method according to claim 15, wherein the at least one transistor is included in a pull-down network of the CMOS circuit.

18. The method according to claim 15, wherein the bias voltage is fixed.

19. The method according to claim 15, wherein the bias voltage is variable.

20. The method according to claim 19, wherein the bias voltage depends on a supply voltage of the CMOS circuit.

* * * * *